US006700446B2

United States Patent
Ke

(10) Patent No.: US 6,700,446 B2
(45) Date of Patent: Mar. 2, 2004

(54) PHASE-LOCKED LOOP FREQUENCY SYNTHESIZER INCLUDING CONTROLLABLE SYNCHRONOUS FREQUENCY DIVIDERS CONTROLLED BY A COMMON FREQUENCY DIVIDING CONTROL SIGNAL

(75) Inventor: Ling-Wei Ke, Tainan Hsien (TW)

(73) Assignee: Mediatek Inc., Hsinchu Hsien (TW)

( * ) Notice: Subject to any disclaimer, the term of this patent is extended or adjusted under 35 U.S.C. 154(b) by 0 days.

(21) Appl. No.: 10/104,957

(22) Filed: Mar. 19, 2002

(65) Prior Publication Data

US 2002/0163395 A1 Nov. 7, 2002

(30) Foreign Application Priority Data

Mar. 21, 2001 (TW) ........................................ 90106689 A

(51) Int. Cl.[7] ................................................ H03L 7/00
(52) U.S. Cl. ................................. 331/1 A; 331/DIG. 2; 327/156; 375/376
(58) Field of Search ................................. 327/146, 147, 327/148, 151, 155–157, 162, 163; 331/1 A, 25, 16, 10, DIG. 2; 375/373–376

(56) References Cited

U.S. PATENT DOCUMENTS 5,036,295 A * 7/1991 Kamitani ..................... 331/10
5,045,813 A * 9/1991 Yamashita et al. ............. 331/16
5,339,050 A * 8/1994 Llewellyn .................... 331/16
6,469,583 B1 * 10/2002 Usui .......................... 331/1 A

* cited by examiner

Primary Examiner—Minh Nguyen
(74) Attorney, Agent, or Firm—Christensen O'Connor Johnson Kindness PLLC

(57) ABSTRACT

A phase-locked loop frequency synthesizer includes a first variable frequency divider connected between a reference signal generator and a first controllable synchronous frequency divider. A second frequency divider is connected between a second controllable synchronous frequency divider and a voltage controlled oscillator. A phase-frequency comparator compares first and second low frequency signals from the first and second controllable synchronous frequency dividers and outputs an adjust signal according to a detected difference therebetween. A phase-locked detector outputs a phase-locked signal in response to the adjust signal. A switching control logic is operable so as to supply a frequency dividing control signal to the first and second controllable synchronous frequency dividers with reference to a divided reference signal from the first variable frequency divider upon receiving the phase-locked signal from the phase-locked detector.

4 Claims, 4 Drawing Sheets

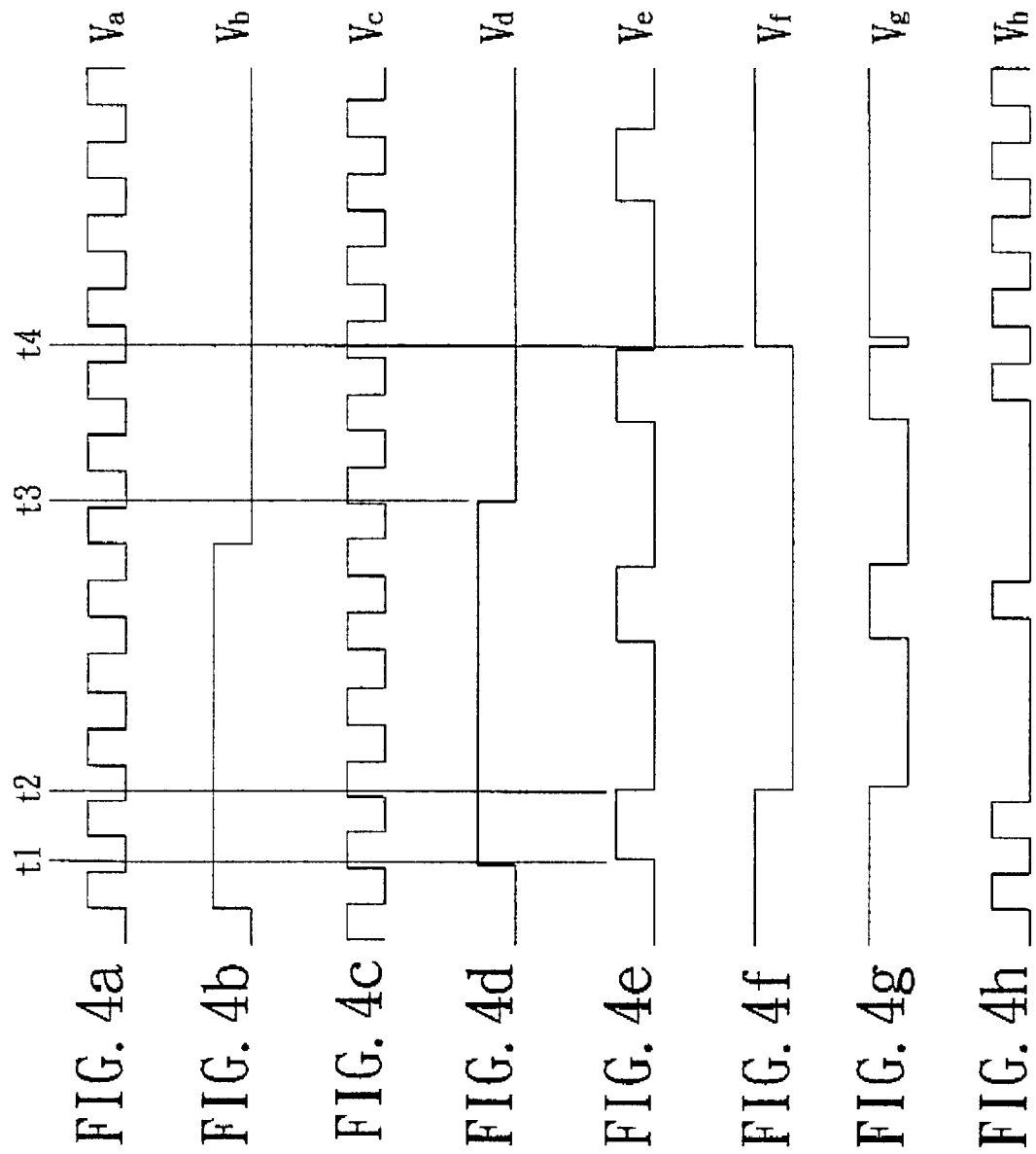

PHASE-LOCKED LOOP FREQUENCY SYNTHESIZER INCLUDING CONTROLLABLE SYNCHRONOUS FREQUENCY DIVIDERS CONTROLLED BY A COMMON FREQUENCY DIVIDING CONTROL SIGNAL

CROSS-REFERENCE TO RELATED APPLICATION

This application claims priority of Taiwan patent Application No. 90106689, filed on Mar. 21, 2001.

BACKGROUND OF THE INVENTION

1. Field of the Invention

The invention relates to a frequency synthesizer, more particularly to a phase-locked loop frequency synthesizer.

2. Description of the Related Art

FIG. 1 illustrates a conventional phase-locked loop frequency synthesizer disclosed in U.S. Pat. No. 5,173,665, entitled "PLL Frequency Synthesizer Capable of Changing an Output Frequency at a High Speed". The conventional phase-locked loop frequency synthesizer includes a reference signal generator 121, a first pulse removing circuit 131, a second pulse removing circuit 132, a phase-frequency comparator 124, a charge pump circuit 125, a loop filter 126, a voltage controlled oscillator 122, and a variable frequency divider 123.

One of the drawbacks of the conventional phase-locked loop frequency synthesizer disclosed in the aforesaid. U.S. Patent resides in that, due to the absence of a common control signal for controlling the first and second pulse removing circuits 131, 132, synchronized operation of the first and second pulse removing circuits 131, 132 cannot be ensured. In other words, the first and second pulse removing circuits 131, 132 may produce a synchronous first and second pulse removed signals when the divisors A1, A2 are changed.

SUMMARY OF THE INVENTION

Therefore, the object of the present invention is to provide a phase-locked loop frequency synthesizer that includes a pair of controllable synchronous frequency dividers controlled by a common frequency dividing control signal.

According to the present invention, a phase-locked loop frequency synthesizer comprises:

- a reference signal generator for generating a reference signal with a reference frequency;
- a voltage controlled oscillator for generating an output signal having an output frequency in response to a control voltage signal received thereby;
- a first variable frequency divider connected to the reference signal generator for frequency dividing the reference signal on the basis of a first divisor so as to generate a divided reference signal;
- a second variable frequency divider connected to the voltage controlled oscillator for frequency dividing the output signal on the basis of a second divisor so as to generate a divided output signal;
- a first controllable synchronous frequency divider connected to the first variable frequency divider for frequency dividing the divided reference signal on the basis of a third divisor upon receiving a frequency dividing control signal so as to generate a first low frequency signal;
- a second controllable synchronous frequency divider connected to the second variable frequency divider for frequency dividing the divided output signal on the basis of the third divisor upon receiving the frequency dividing control signal so as to generate a second low frequency signal;
- a phase-frequency comparator connected to the first and second controllable synchronous frequency dividers for receiving the first and second low frequency signals therefrom, the phase-frequency comparator comparing the first and second low frequency signals and outputting an adjust signal according to a detected difference therebetween;
- a control voltage generating circuit connected to the voltage controlled oscillator and the phase-frequency comparator, the control voltage generating circuit supplying the control voltage signal to the voltage controlled oscillator in response to the adjust signal;
- a phase-locked detector connected to the phase-frequency comparator for outputting a phase-locked signal in response to the adjust signal; and
- a switching control logic connected to the phase-locked detector, the control voltage generating circuit, the first variable frequency divider, and the first and second controllable synchronous frequency dividers, the switching control logic being operable so as to supply the frequency dividing control signal to the first and second controllable synchronous frequency dividers with reference to the divided reference signal from the first variable frequency divider upon receiving the phase-locked signal from the phase-locked detector.

BRIEF DESCRIPTION OF THE DRAWINGS

Other features and advantages of the present invention will become apparent in the following detailed description of the preferred embodiment with reference to the accompanying drawings, of which:

FIGS. 4a to 4h are timing diagrams describing operation of the first controllable synchronous frequency divider illustrated in FIG. 3.

DETAILED DESCRIPTION OF THE PREFERRED EMBODIMENT

Figure 1:
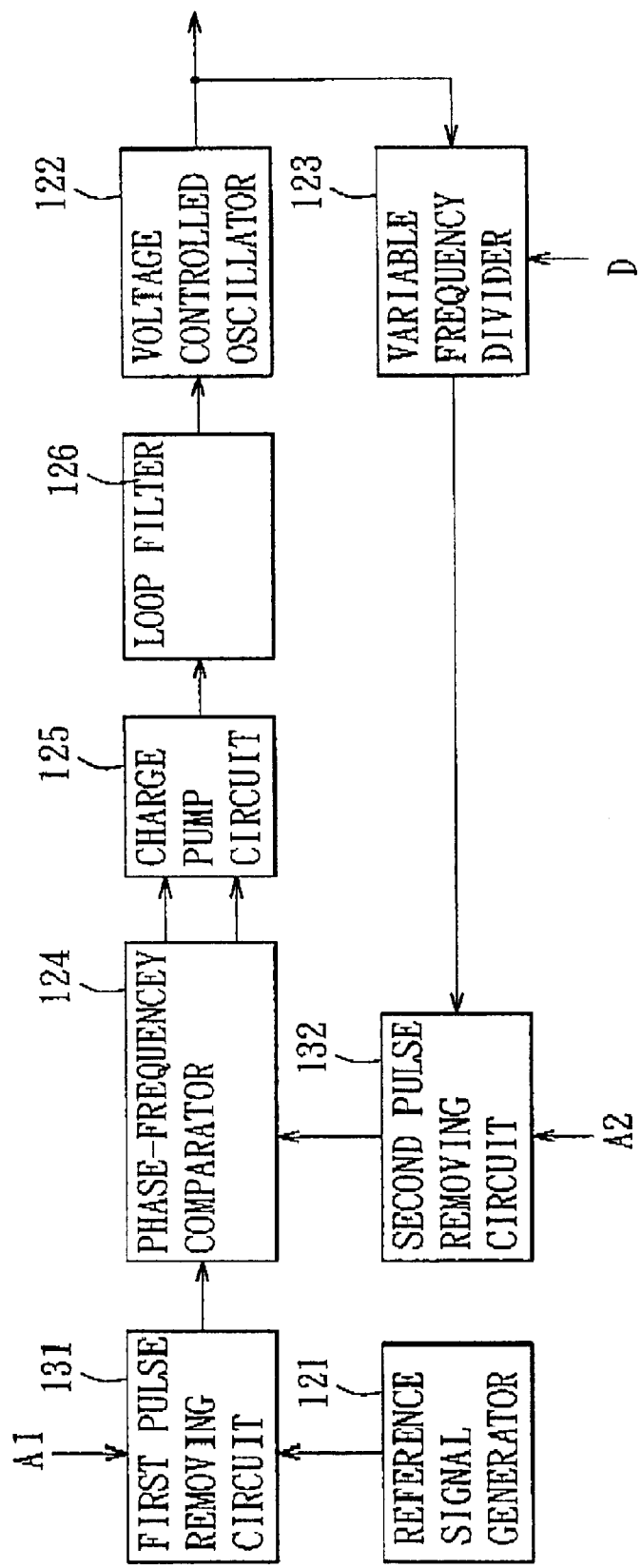
FIG. 1 is a schematic circuit block diagram illustrating a conventional phase-locked loop frequency synthesizer.
Figure 2:
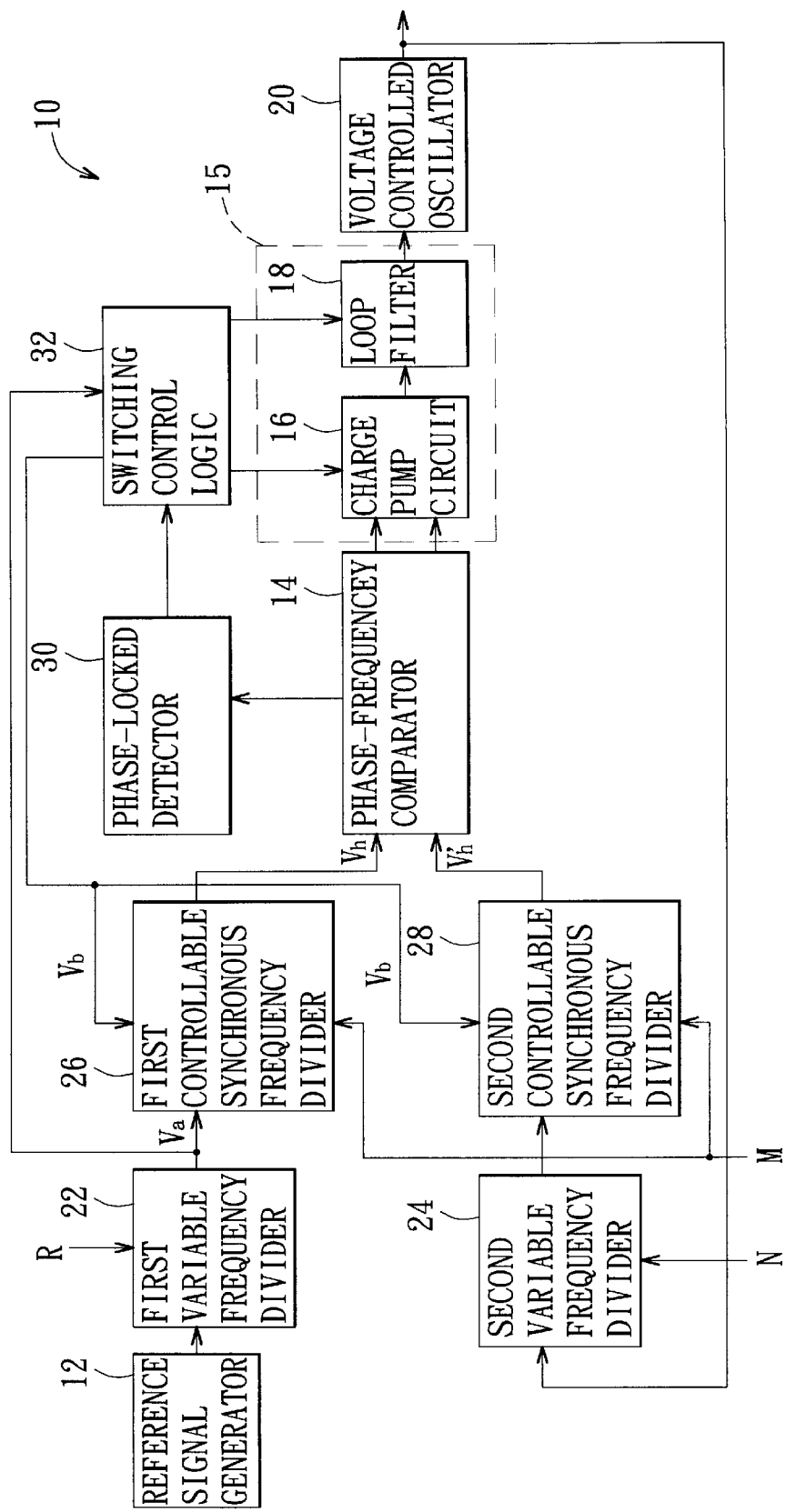
FIG. 2 is a schematic circuit block diagram illustrating the preferred embodiment of a phase-locked loop frequency synthesizer according to the present invention.

Referring to FIG. 2, the preferred embodiment of a phase-locked loop frequency synthesizer according to the present invention is shown to include a reference signal generator 12, a voltage controlled oscillator 20, a first variable frequency divider 22, a second variable frequency divider 24, a first controllable synchronous frequency divider 26, a second controllable synchronous frequency divider 28, a phase-frequency comparator 14, a control voltage generating circuit 15, a phase-locked detector 30, and a switching control logic 32.

The reference signal generator 12 generates a is reference signal with a reference frequency (Fref).

The voltage controlled oscillator 20 generates an output signal having an output frequency (Fvco) in response to a control voltage signal received thereby.

The first variable frequency divider 22 is connected to the reference signal generator 12 for frequency dividing the reference signal on the basis of a first divisor (R) so as to generate a divided reference signal (Va).

The second variable frequency divider 24 is connected to the voltage controlled oscillator 20 for frequency dividing the output signal on the basis of a second divisor (N) so as to generate a divided output signal.

The first controllable synchronous frequency divider 26 is connected to the first variable frequency divider 22 for frequency dividing the divided reference signal on the basis of a third divisor (M) upon receiving a frequency dividing control signal (Vb) so as to generate a first low frequency signal (Vh).

The second controllable synchronous frequency divider 28 is connected to the second variable frequency divider 24 for frequency dividing the divided output signal on the basis of the third divisor (M) upon receiving the frequency dividing control signal (Vb) so as to generate a second low frequency signal (Vh').

The phase-frequency comparator 14 is connected to the first and second controllable synchronous frequency dividers 26, 28 for receiving the first and second low frequency signals (Vh, Vh') therefrom. The phase-frequency comparator 14 compares the first and second low frequency signals (Vh, Vh') and outputs an adjust signal according to a detected difference therebetween. It is noted that the phase-frequency comparator 14 has an operating frequency (Fpfd) that is related to the first divisor (R), the second divisor (N), the reference frequency (Fref) of the reference signal, and the output frequency (Fvco) of the output signal in the following manner:

$$Fpfd = \frac{Fref}{R} = \frac{Fvco}{N}.$$

The control voltage generating circuit 15 is connected to the voltage controlled oscillator 20 and the phase-frequency comparator 14, and supplies the control voltage signal, in a known manner, to the voltage controlled oscillator 20 in response to the adjust signal. In this embodiment, the control voltage generating circuit 15 includes a charge pump circuit 16 and a loop filter 18. The charge pump circuit 16 acts as a current flow control circuit for controlling flow-in and flow-out of current to generate a current flow control signal. The current flow control signal is supplied to the loop filter 18. The loop filter 18 filters the current flow control signal into a filtered signal which serves as the control voltage signal.

The phase-locked detector 30 is connected to the phase-frequency comparator 14 for outputting a phase-locked signal in response to the adjust signal.

The switching control logic 32 is connected to the phase-locked detector 30, the control voltage generating circuit 15, the first variable frequency divider 22, and the first and second controllable synchronous frequency dividers 26, 28. The switching control logic 32 is operable so as to supply the frequency dividing control signal (Vb) to the first and second controllable synchronous frequency dividers 26, 28 with reference to the divided reference signal from the first variable frequency divider 22 upon receiving the phase-locked signal from the phase-locked detector 30.

Figure 3:
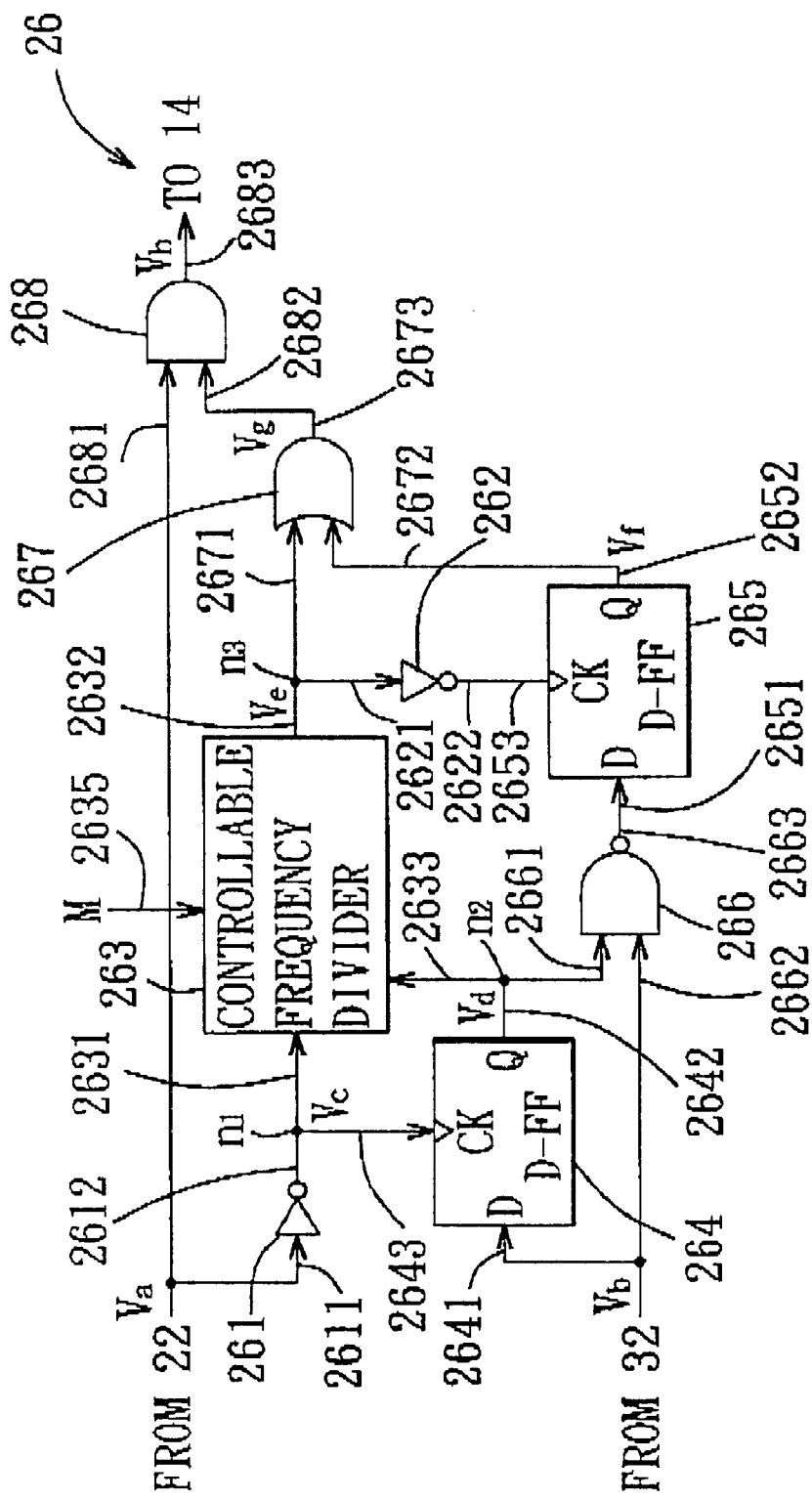
FIG. 3 is a schematic electrical circuit diagram illustrating a first controllable synchronous frequency divider of the preferred embodiment.

The first and second controlled synchronous frequency dividers 26, 28 are identical in construction. FIG. 3 is a schematic circuit block diagram of an embodiment of the first controllable synchronous frequency divider 26. Referring to FIG. 3, the first controllable synchronous frequency divider 26 includes a first inverter 261, a first flip-flop 264, a controllable frequency divider 263, a NAND gate 266, a second inverter 262, a second flip-flop 265, an OR gate 267, and an AND gate. The first inverter 261 has an input 2611 connected to the first variable frequency divider 22 for receiving the divided reference signal (Va) therefrom, and an output 2612 connected to a first node (n1) for outputting an output signal (Vc). The first flip-flop 264 is a D-type flip-flop having a first input 2641 connected to the switching control logic 32 for receiving the frequency dividing control signal (Vb) therefrom, a clock input 2643 connected to the first node (n1) for receiving the output signal (Vc) from the output 2611 of the first inverter 261, and an output 2642 connected to a second node (n2) for outputting an output signal (Vd). The controllable frequency divider 263 has a first input 2631 connected to the first node (n1), a reset signal input 2633 connected to the second node (n2), a divider input 2635 to receive the third divisor (M), and an output 2632 connected to a third node (n3). The controllable frequency divider 263 receives the output signal (Vc) from the output 2612 of the first inverter 261, and the output signal (Vd) from the output 2642 of the first flip-flop 264 as a reset signal for frequency dividing the output signal (Vc) on the basis of the third divisor (M) so as to output an output signal (Ve) at the output 2632. The NAND gate 262 has a frist input 2621 connected to the third node (n3) for receiving the output signal (Vd) from the output 2642 of the first flip-flop 264, a second input 2662 connected to the switching control logic 32 for receiving the frequency dividing control signal (Vb) therefrom, and an output 2663 for outputting an output signal. The second inverter 262 has an input connected to the third node (n3) for receiving the output signal (Ve) from the output 2632 of the controllable frequency divider 263, and an output 2622 for outputting an output signal. The second flip-flop 265 is a D-type flip-flop having a first input 2651 connected to the output 2663 of the NAND gate 266 for receiving the output signal of the latter, a clock input 2653 connected to the output 2622 of the second inverter 262 for receiving the output signal of the latter, and an output 2652 for outputting an output signal (Vf). The OR gate 267 has a first input 2671 connected to the third node (n3) for receiving the output signal (Ve) from the output 2632 of the controllable frequency divider 263, a second input 2672 connected to the output 2652 of the second flip-flop 265 for receiving the output signal (Vf) therefrom, and an output 2673 for outputting an output signal (Vg). The AND gate 268 has a first input connected to the first variable frequency divider 22 for receiving the first divided reference signal (Va) therefrom, a second input 2682 connected to the output 2673 of the OR gate 267 for receiving the output signal (Vg) therefrom, and an output 2683 connected to the phase-frequency comparator 14 for outputting the first low frequency signal (Vh).

With reference to FIG. 4, the following description is provided to illustrate operation of the first controllable synchronous frequency divider 26 when the third divisor (M) is equal to 3. When the frequency dividing control signal (Vb) is outputted, namely, a logic level thereof changes from "0" to "1", the controllable frequency divider 263 is reset by the output signal (Vd) at time (t1) to frequency divide the output signal (Vc) so as to obtain the output signal (Ve). Thereafter, when a logic level of the output signal (Ve) changes from "1" to "0" at time (t2), the first controllable synchronous frequency divider 26 is operated in a frequency-dividing mode. At time (t3), the logic level of the output signal (Vd) changes from "1" to "0". In this case, a logic level of the output signal (Vf) is held to "0" until time (t4), namely, when the logic level of the output signal (Ve) changes from "1" to "0" (at time (t4)), a logic level of the output signal (Vf) changes from "0" to "1", and the first controllable synchronous frequency divider 26 ceases to operate in the frequency-dividing mode. As a result, during time (t2) to time (t4), the first controllable synchronous frequency divider 26 is operated in the frequency-dividing mode so as to output the first low frequency signal (Vh) with a frequency equal to a third of that of the divided reference signal (Va).

Due to the presence of the phase-locked detector 30 of this invention, the first and second controllable synchronous frequency dividers 26, 28 can be synchronously switched to the frequency-dividing mode under the control of the frequency dividing control signal (Vb) such that the synchronous first and second low frequency signals (Vh, Vh') can be ensured.

Furthermore, the second divisor (N) can be a fraction (i.e., the second variable frequency divider 24 is a fraction frequency divider). In this case, the third divisor (M) is an integer, and is a multiple of a denominator (F) of the second divisor (N) (i.e., the value of M/F is an integer). As such, when the second divisor (N) is a fraction, a compensation current is not needed for the second variable frequency divider 24 during operation in the frequency-dividing mode, In view of the construction of the phase-locked loop frequency synthesizer of this invention, phase-frequency comparison can be conducted at a higher frequency for high speed when a phase-locked state has yet to be attained, and at a lower frequency for system stability when the phase-locked state is achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A phase-locked loop frequency synthesizer comprising;
   a reference signal generator for generating a reference signal with a reference frequency;
   a voltage controlled oscillator for generating an output signal having an output frequency in response to a control voltage signal received thereby;
   a first variable frequency divider connected to said reference signal generator for frequency dividing the reference signal on the basis of a first divisor so as to generate a divided reference signal;
   a second variable frequency divider connected to said voltage controlled oscillator for frequency dividing the output signal on the basis of a second divisor so as to generate a divided output signal;
   a first controllable synchronous frequency divider connected to said first variable frequency divider for frequency dividing the divided reference signal on the basis of a third divisor upon receiving a frequency dividing control signal so as to generate a first low frequency signal;
   a second controllable synchronous frequency divider connected to said second variable frequency divider for frequency dividing the divided output signal on the basis of the third divisor upon receiving the frequency dividing control signal so as to generate a second low frequency signal;
   a phase-frequency comparator connected to said first and second controllable synchronous frequency dividers for receiving the first and second low frequency signals therefrom, said phase-frequency comparator comparing the first and second low frequency signals and outputting an adjust signal according to a detected difference therebetween;
   a control voltage generating circuit connected to said voltage controlled oscillator and said phase-frequency comparator, said control voltage generating circuit supplying the control voltage signal to said voltage controlled oscillator in response to the adjust signal;
   a phase-locked detector connected to said phase-frequency comparator for outputting a phase-locked signal in response to the adjust signal; and
   a switching control logic connected to said phase-locked detector, said control voltage generating circuit, said first variable frequency divider, and said first and second controllable synchronous frequency dividers, said switching control logic being operable so as to supply the frequency dividing control signal to said first and second controllable synchronous frequency dividers with reference to the divided reference signal from said first variable frequency divider upon receiving the phase-locked signal from said phase-locked detector.

2. The phase-locked loop frequency synthesizer as claimed in claim 1, wherein each of said first and second controllable synchronous frequency dividers includes:
   a first inverter having an input connected to a respective one of said first and second variable frequency dividers, and an output connected to a first node;
   a first flip-flop having a first input connected to said switching control logic, a clock input connected to said first node, and an output connected to a second node;
   a controllable frequency divider having a first input connected to said first node, a reset signal input connected to said second node, a divider input to receive the third divisor, and an output connected to a third node;
   a NAND gate having a first input connected to said second node, a second input connected to said switching control logic, and an output;
   a second inverter having an input connected to said third node, and an output;
   a second flip-flop having a first input connected to said output of said NAND gate, a clock input connected to said output of said second inverter, and an output;
   an OR gate having a first input connected to said third node, a second input connected to said output of said second flip-flop, and an output; and
   an AND gate having a first input connected to the respective one of said first and second variable frequency dividers, a second input connected to said output of said OR gate, and an output connected to said phase-frequency comparator.

3. The phase-locked loop frequency synthesizer as claimed in claim 1, wherein R denotes the first divisor, N denotes the second divisor, Fref denotes the reference frequency, Fvco denotes the output frequency, and Fpfd denotes an operating frequency of said phase-frequency comparator, R, N, Fref, Fvco, Fpfd having a relation in which $$Fpfd = \frac{Fref}{R} = \frac{Fvco}{N}.$$

4. The phase-locked loop frequency synthesizer as claimed in claim 3, wherein, when the second divisor (N) is a fraction, the third divisor (M) is an integer and is a multiple of a denominator of the second divisor (N).

\* \* \* \* \*